(12) United States Patent
Chuang et al.

(10) Patent No.: US 9,184,252 B2
(45) Date of Patent: Nov. 10, 2015

(54) FLASH MEMORY EMBEDDED WITH HKMG TECHNOLOGY

(71) Applicant: Taiwan Semiconductor Manufacturing Company, Ltd., Hsin-Chu (TW)

(72) Inventors: Harry-Hak-Lay Chuang, Singapore (SG); Wei Cheng Wu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/182,642

(22) Filed: Feb. 18, 2014

(65) Prior Publication Data

US 2015/0137207 A1   May 21, 2015

Related U.S. Application Data

(60) Provisional application No. 61/904,975, filed on Nov. 15, 2013.

(51) Int. Cl.
*H01L 29/788* (2006.01)
*H01L 29/49* (2006.01)
*H01L 27/115* (2006.01)
*H01L 29/51* (2006.01)

(52) U.S. Cl.
CPC .......... *H01L 29/49* (2013.01); *H01L 27/11517* (2013.01); *H01L 29/517* (2013.01)

(58) Field of Classification Search
CPC .................................................. H01L 27/11517
USPC .............................. 257/314–316; 365/185.01
See application file for complete search history.

(56) References Cited

U.S. PATENT DOCUMENTS

| 2004/0077144 A1* | 4/2004 | Hsieh ............................. 438/257 |
| 2007/0241386 A1* | 10/2007 | Wang et al. ................... 257/314 |
| 2013/0026578 A1* | 1/2013 | Tsau ............................. 257/368 |
| 2014/0264538 A1* | 9/2014 | Yu et al. ....................... 257/316 |

OTHER PUBLICATIONS

Lee, Wen-Chin et al., "Observation of Reduced Poly-Gate Depletion Effect for Poly-Si0.8Ge0.2-Gated NMOS Devices," Electrochemical and Solid-State Letters, 1(1) 58-59, Apr. 1998.

* cited by examiner

*Primary Examiner* — Steven Loke
*Assistant Examiner* — Arash Majdi
(74) *Attorney, Agent, or Firm* — Slater & Matsil, L.L.P.

(57) ABSTRACT

An integrated circuit structure includes a flash memory cell and a logic MOS device. The flash memory cell includes a floating gate dielectric, a floating gate overlying the floating gate dielectric, a control gate overlying the floating gate, a word-line on a first side of the floating gate and the control gate, and an erase gate on a second side of the floating gate and the control gate. The logic MOS device includes a high-k gate dielectric, and a gate electrode over the high-k gate dielectric. The gate electrode, the control gate, the word-line, and the erase gate are formed of a same metal-containing material, and have top surfaces coplanar with each other.

20 Claims, 5 Drawing Sheets

FLASH MEMORY EMBEDDED WITH HKMG TECHNOLOGY

PRIORITY CLAIM AND CROSS-REFERENCE

This application claims the benefit of U.S. Provisional Application Ser. No. 61/904,975, filed on Nov. 15, 2013, entitled "Novel Metal WL/CG/EG Gate ESF3 Memory Embedded in HKMG Technology," which application is hereby incorporated herein by reference.

BACKGROUND

Flash memories have become increasingly popular in recent years. A typical flash memory includes a memory array having a large number of memory cells arranged as an array. Each of the memory cells is fabricated as a field-effect transistor having a control gate and a floating gate. The floating gate is capable of holding charges, and is separated from source and drain regions contained in a substrate by a layer of thin oxide. Each of the memory cells can be electrically charged by injecting electrons from the substrate into the floating gate. The charges can be removed from the floating gate by tunneling the electrons to the source region or an erase gate during an erase operation. The data in flash memory cells are thus determined by the presence or absence of charges in the floating gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
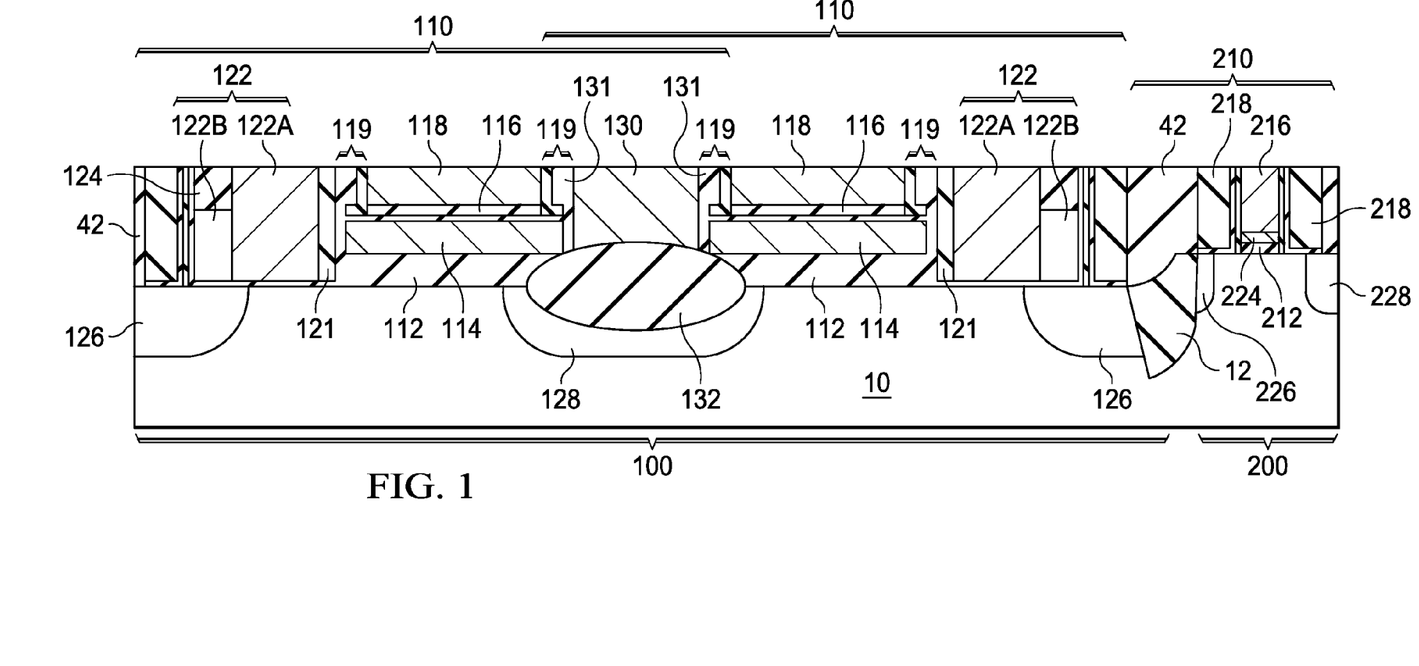
FIG. 1 illustrates a cross-sectional view of flash memory cells and a logic Metal-Oxide-Semiconductor (MOS) device in accordance with some embodiments, wherein the logic MOS device includes a High-K (HK) dielectric and a Metal Gate (MG)

FIG. 1 illustrates a cross-sectional view of flash memory cells 110 and logic Metal-Oxide-Semiconductor (MOS) device 210 in accordance with some embodiments. Flash memory cells 110 are formed in flash memory device region 100, and logic MOS device 210 is formed in logic MOS device region 200. Logic MOS device 210 and flash memory cells 110 are on the same substrate 10, and are in the same chip and wafer. Logic MOS device 210 may be a core MOS device, a high-voltage MOS device, a Static Random Access Memory (SRAM) device, an analog MOS device, an Input/output (IO) MOS device, or the like.

Semiconductor substrate 10 may be formed of silicon, germanium, III-V compound semiconductor, or other applicable semiconductor materials. Isolation regions such as Shallow Trench Isolation (STI) regions 12 are formed in semiconductor substrate 10 for device isolation.

FIG. 1 illustrates two flash memory cells 110 sharing common source 128, Inter-poly oxide (IPO) 132, and erase gate 130. Flash memory cell 110 includes floating gate dielectric 112. Floating gate dielectric 112 may be formed of an oxide, and hence is referred to as floating gate oxide 112 hereinafter. Other dielectric materials such as nitrides, high-k dielectrics, or multi-layers thereof may also be used. Floating gate oxide 112 is formed on the top surface of semiconductor substrate 10. Floating gate oxide 112 may also be formed using silicon oxynitride.

Floating gate 114 is formed over floating gate oxide 112. In some exemplary embodiments, floating gate 114 comprises polysilicon, which may be implanted with a p-type or an n-type impurity, followed by an anneal step to activate the implanted impurity. In alternative embodiments, other conductive materials such as metal or metal alloys are used to form floating gate 114. In yet alternative embodiments, floating gate 114 is formed of a charge-trapping dielectric material such as silicon nitride.

Blocking layer 116 is formed over floating gate 114. Blocking layer 116 may comprise silicon oxynitride in some embodiments. Furthermore, blocking layer 116 may have an Oxide-Nitride-Oxide (ONO) structure including an oxide layer, a nitride layer over the oxide layer, and additional oxide layer over the nitride layer. In alternative embodiments, other materials such as a single oxide layer, a single high-k dielectric layer, a single nitride layer, or multi-layers thereof, can also be used.

Control gate 118 is formed over blocking layer 116. Control gate 118 is formed of a metal-containing material comprising a metal or a metal alloy. The atomic percentage of all metals in control gate 118 may be greater than about 30 percent, greater than about 50 percent, greater than about 70 percent, or greater than about 90 percent. The material for forming control gate 118 is the same as the material of gate electrode 216 in logic MOS device 210. In some embodiments, logic MOS device 210 is a P-type MOS (PMOS) device, and control gate 118 and gate electrode 216 have a high work function, which is higher than, for example, about 4.8 eV. The exemplary metal-containing materials with the high work functions include Pt_, WN, Ni, Ru, Mo, and the like. In alternative embodiments, logic MOS device 210 is an N-type MOS (NMOS) device, and control gate 118 and gate electrode 216 have a low work function, which is lower than, for example, about 4.2 eV. The exemplary materials with the low work functions include Ti, Ta, Nb, Al, TiSi2, and the like. In yet alternative embodiments, control gate 118 and gate electrode 216 have a mid-work-function between about 4.2 eV and about 4.8 eV. Control gate 118 and gate electrode 216 are free from silicon in some embodiments.

Control-gate spacers 119 are formed on the sidewalls of control gate 118. In some exemplary embodiments, control-gate spacer 119 includes an L-shaped oxide (such as silicon oxide) layer, and a nitride layer (such as a silicon nitride layer) on the horizontal leg of the oxide layer. The top end of control-gate spacer 119 is level with the top surface of control gate 118 in some embodiments. Control-gate spacers 119 overlap the edge portions of floating gate 114.

Floating gate spacer 121 is formed on the sidewall of floating gate 114. The formation of floating gate spacer 121 may include forming a blanket dielectric layer in device regions 100 and 200, and performing an anisotropic etching to remove the horizontal portions of the blanket dielectric layer. The vertical portions of the blanket dielectric layer are left as floating gate spacers 121.

Word-line 122 is formed on a side of floating gate spacer 121, wherein word-line 122 and floating gate 116 are on the opposite sides of gate spacer 121. Word-line 122 is sometimes referred to as a selection gate in some embodiments. In some exemplary embodiments, word-line 122 is formed of a metal-containing material comprising a metal or a metal alloy. In some exemplary embodiments, word-line 122 includes portion 122A and portion 122B. The material of portion 122A of word-line 122 may be the same as the material of control gate 118, and hence is formed of the metal-containing material. The top surface of portion 122A is level with the top surface of control gate 118.

The portion 122B of word-line 122 comprises polysilicon. A sidewall of portion 122B of word-line 122 is in contact with a sidewall of portion 122A of word-line 122. Hence, portion 122A is electrically connected to portion 122B. The top surface of portion 122B is lower than the top surface of portion 122A. Hence, portions 122A and 122B in combination form the L-shaped word-line 122.

Over portion 122B of word-line 122 resides dielectric region 124. In some embodiments, dielectric region 124 comprises a nitride such as silicon nitride. The top surface of dielectric region 124 may be level with the top surface of control gate 118 and the top surface of portion 122A of word-line 122.

Drain region 126 is formed on a side of word-line 122. In some embodiments, drain region 126 is formed by implanting semiconductor substrate 10 with a p-type or an n-type impurity. In addition, source region 128 is formed in semiconductor substrate 10, and is also formed by implanting semiconductor substrate 10 with a p-type or an n-type impurity. Drain region 126 and source region 128 are on the opposite sides of floating gate 114 and word-line 122. Source region 128 is shared by two neighboring flash memory cells 110, and is referred to as a common source region.

Dielectric region 132, which is sometimes referred to as an Inter-Poly Oxide (IPO), is formed to insulate the overlying erase gate 130 from the underlying common source 128. IPO 132 is thick so that a high voltage may be applied on erase gate 130 without causing electrical breakdown of IPO 132. Dielectric region 132 may be formed by a thermal oxidation of the surface portion of common source 128, or by depositing a dielectric layer.

Erase gate 130 is formed over dielectric region 132 and common source 128. Erase gate 130 and word-line 122 are on a side of floating gate spacer 131, which electrically insulates floating gate 114 from erase gate 130. In some exemplary embodiments, erase gate 130 is formed of the metal-containing material comprising a metal or a metal alloy. The material of erase gate 130 may be the same as the material of control gate 118 and word-line portion 122A. The top surface of erase gate 130 is level with the top surface of control gate 118 in some embodiments.

In logic device region 200, logic MOS device 210 is formed. Logic MOS device 210 includes gate dielectric 212, and may include conductive barrier layer 224 over gate dielectric 212. In some embodiments, gate dielectric 212 includes an interfacial oxide layer, and a high-k dielectric layer over the interfacial oxide layer. In some exemplary embodiments, the interfacial oxide layer comprises silicon oxide, and the high-k dielectric layer comprises a high-k dielectric material, which may be selected from hafnium oxide, aluminum oxide, lanthanum oxide, or the like. Conductive barrier layer 224 may comprise titanium, titanium nitride, tantalum, tantalum nitride, or the like.

Gate electrode 216 is formed over conductive barrier layer 224. In some exemplary embodiments, as discussed above, logic MOS device 210 is a PMOS device, and gate electrode 216 has the high work function. In alternative embodiments, as also discussed above, logic MOS device 210 is an NMOS device, and gate electrode 216 has the low work function. Gate electrode 216, control gate 118, word-line portion 122A, and erase gate 130 may be formed simultaneously using the same metal-containing material. Furthermore, the top surfaces of gate electrode 216, control gate 118, word-line portion 122A, and erase gate 130 may be coplanar.

Logic MOS device 210 further includes source region 226 and drain region 228, which are formed in semiconductor substrate 10. The impurity doped in source region 226 and drain region 228 is determined by the conductivity type of logic MOS device 210. When logic MOS device 210 is a PMOS device, source region 226 and drain region 228 are p-type regions. When logic MOS device 210 is an NMOS device, source region 226 and drain region 228 are n-type regions. Gate spacers 218 are formed on the opposite sides of gate electrode 216.

Figure 2:
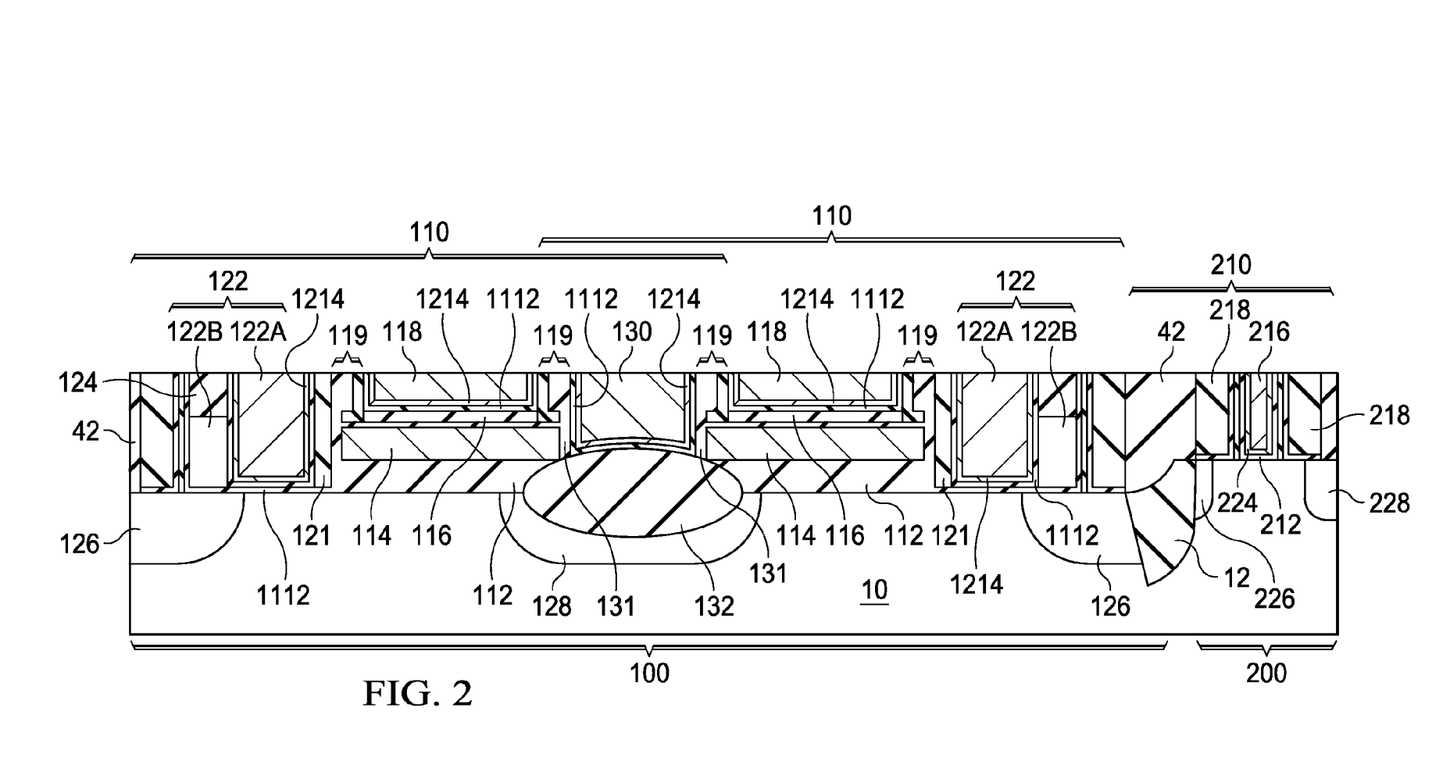
FIG. 2 illustrates a cross-sectional view of flash memory cells and a logic MOS device in accordance with some embodiments, wherein a high-k gate dielectric is formed in the flash memory cells.

FIG. 2 illustrates the cross-sectional view of flash memory cells 110 and logic MOS device 210 in accordance with alternative embodiments. These embodiments are similar to the embodiments shown in FIG. 1, except that dielectric layer 1112 and conductive barrier layer 1214 are formed underlying one or more of control gate 118, word-line portion 122A, and word-line 130. Dielectric layer 1112 and gate dielectric 212 may be formed of the same dielectric material, and may be formed simultaneously in the same replacement-gate process. Conductive barrier layer 1214 and conductive barrier layer 224 are formed of the same dielectric material, and are formed simultaneously in the same replacement-gate process. Each of the dielectric layer 1112 and conductive barrier layer 1214 comprises a portion underlying the respective control gate 118, word-line portion 122A, and erase gate 130. Due to the replacement-gate process, each of the dielectric layer 1112 and conductive barrier layer 1214 further includes portions on the sidewalls of the respective control gate 118, word-line portion 122A, and erase gate 130.

In the embodiments shown in FIG. 2, portion 122B may be electrically disconnected from portion 122A by the sidewalls portion of dielectric layer 1112. In alternative embodiments, dielectric layer 1112 is not formed underlying each of control gate 118, word-line portion 122A, and erase gate 130. Conductive barrier layer 1214, however, is formed underlying (and on sidewalls of) each of control gate 118, word-line portion 122A, and erase gate 130. Accordingly, portion 122A of word-line 122 includes conductive barrier layer 1214 in these embodiments.

Figure 5:
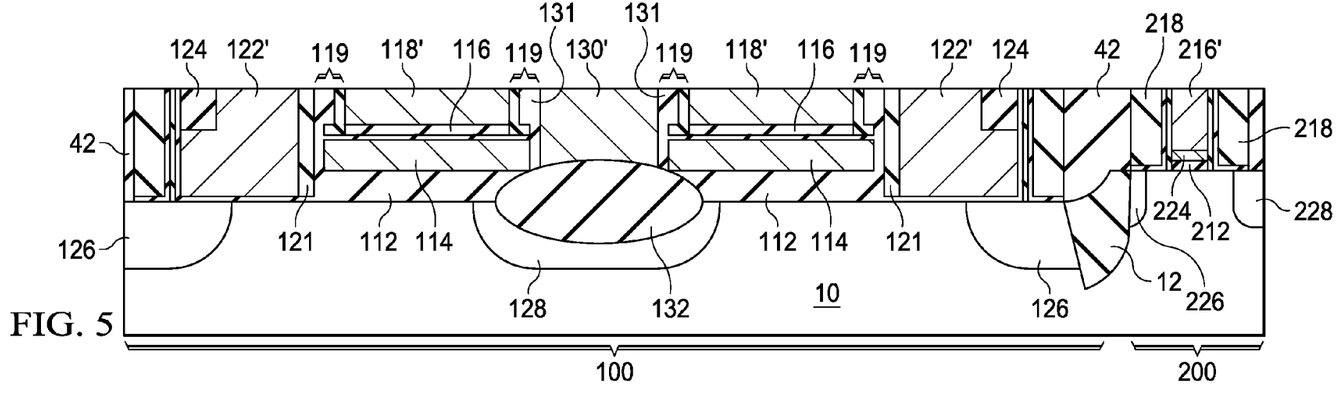
FIGS. 5 through 7 are cross-sectional views of intermediate stages in the formation of flash memory cells and a logic MOS device in accordance with some embodiments.
Figure 6:
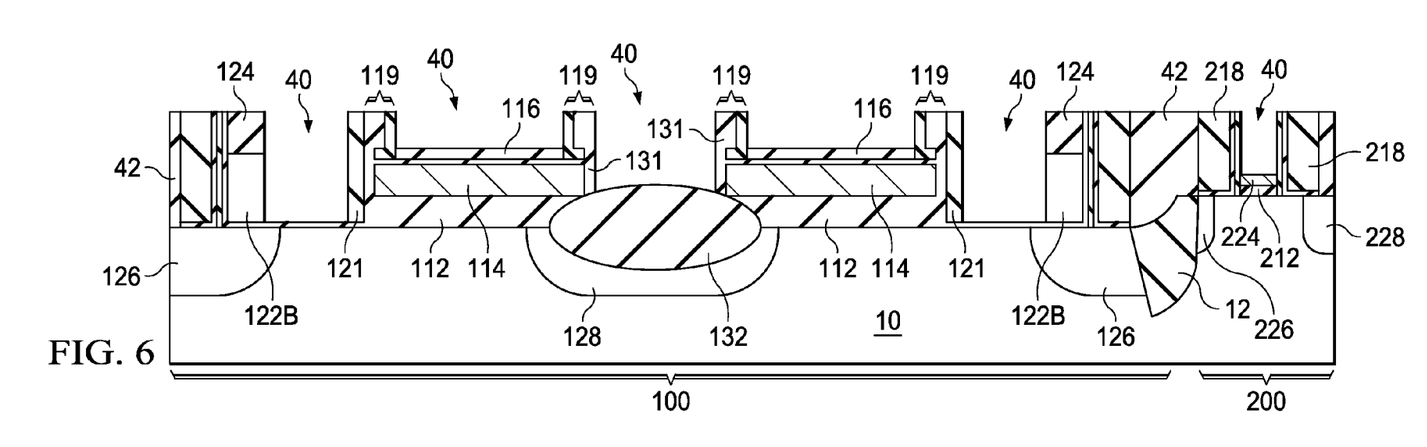
Figure 7:
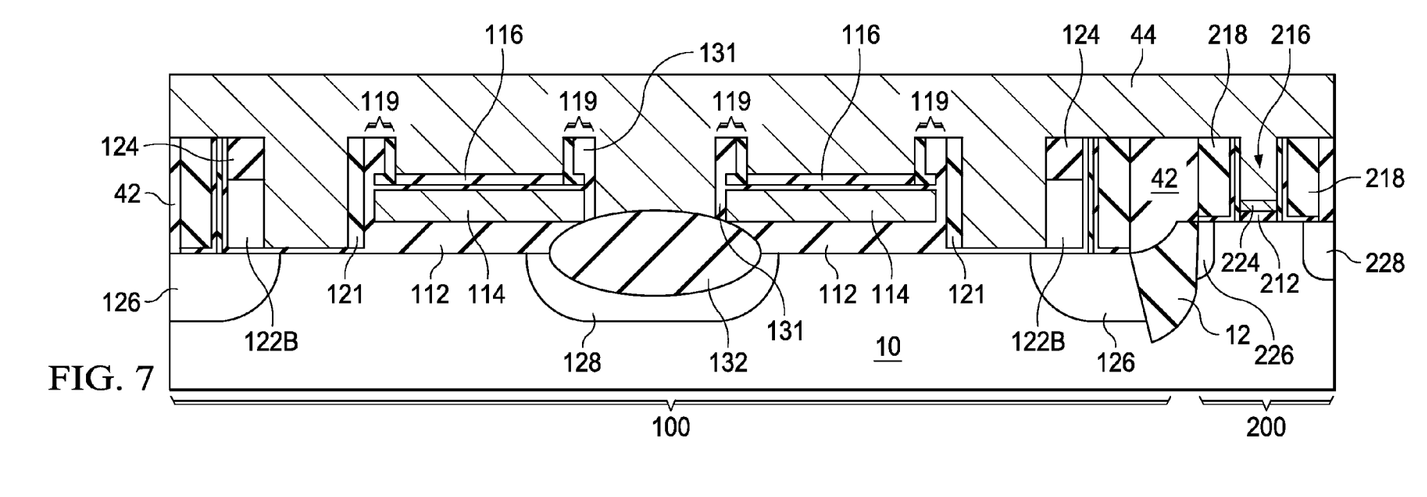

In the embodiments shown in FIG. 1, gate dielectric 212 and conductive barrier layer 224 are formed before the replacement-gate formation process for forming gate electrode 216, control gate 118, word-line portion 122A, and erase gate 130. In alternative embodiments, as shown in FIG. 2, gate dielectric 212 and conductive barrier layer 224 are formed during the replacement-gate formation process (as shown in FIGS. 5 through 7) for forming gate electrode 216, control gate 118, word-line portion 122A, and erase gate 130. Hence, the same gate dielectric and conductive barrier are formed underlying (and on the sidewalls of) each of control gate 118, word-line portion 122A, and erase gate 130.

Figure 3:
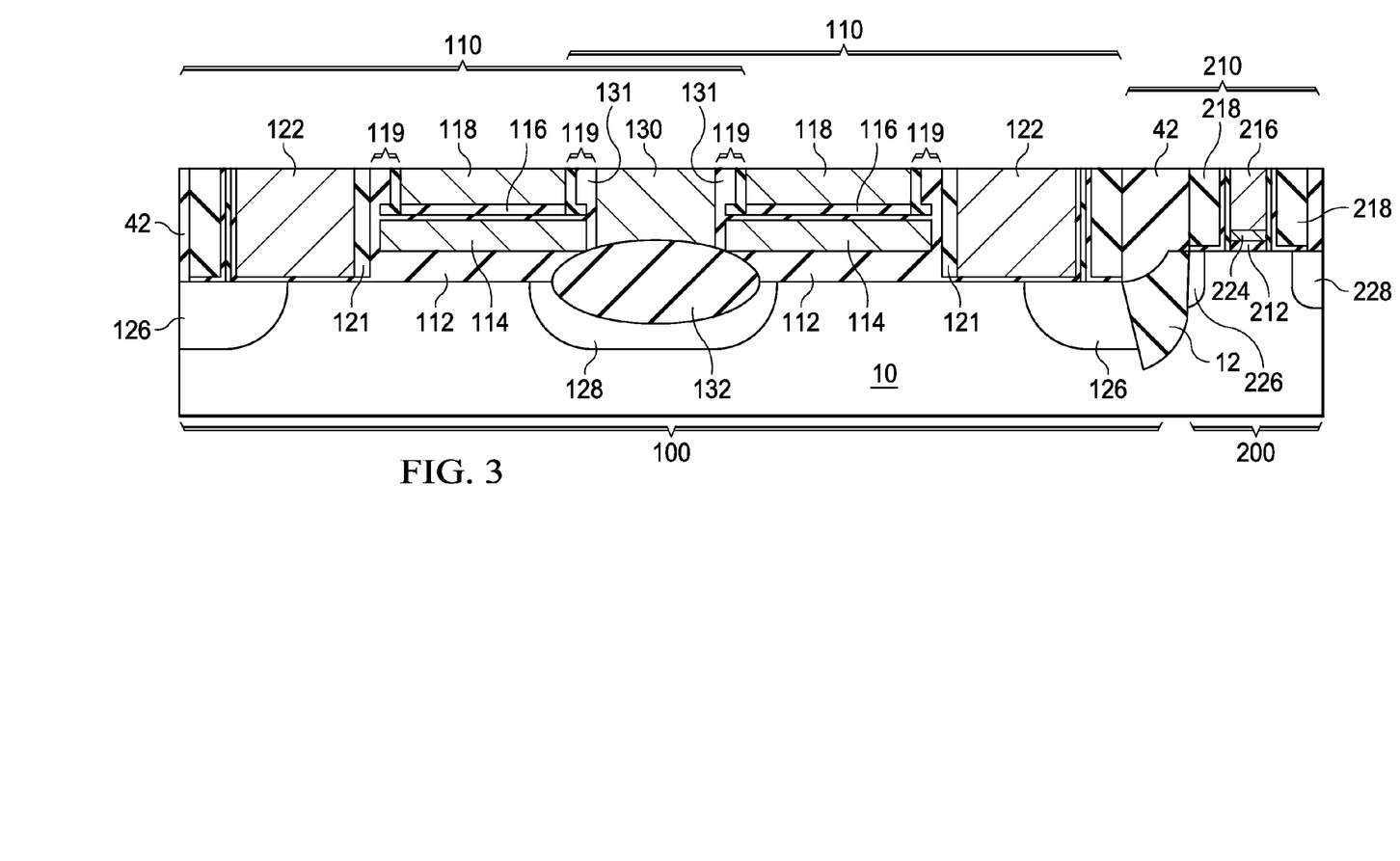
FIG. 3 illustrates a cross-sectional view of flash memory cells and a logic MOS device in accordance with some embodiments, wherein a high-k gate dielectric is formed in the flash memory cells, and wherein word-lines of the flash memory cells have a rectangular cross-sectional shape.

FIG. 3 illustrates the cross-sectional view of flash memory cells 110 and logic MOS device 210 in accordance with alternative embodiments. These embodiments are similar to the embodiments shown in FIG. 1, except that word-line 122, instead of comprising a metal-containing portion 122A and polysilicon portion 122B, is formed of a homogenous material that comprises metal. Word-line 122 may have a rectangular cross-sectional view in these embodiments. Again, gate electrode 216, control gate 118, word-line portion 122A, and erase gate 130 are formed of a same metal-containing material. In the embodiments shown in FIG. 3, the gate dielectric and the conductive barrier layer, which form parts of logic MOS device 210, are not formed underlying control gate 118, word-line portion 122A, and erase gate 130.

Figure 4:
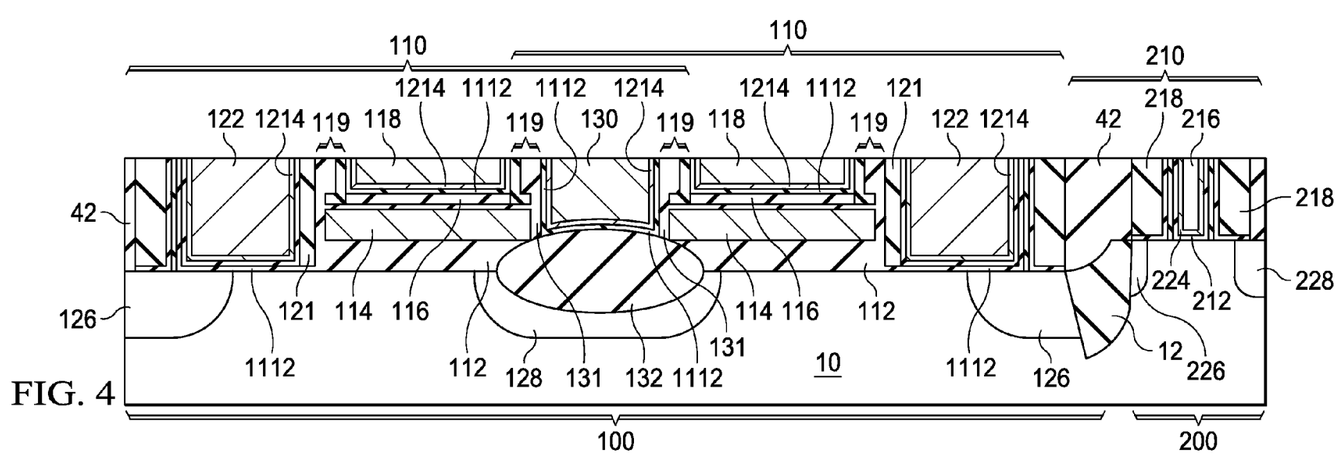
FIG. 4 illustrates a cross-sectional view of flash memory cells and a logic MOS device in accordance with some embodiments, wherein a high-k gate dielectric is formed in the flash memory cells, wherein word-lines of the flash memory cells have a rectangular cross-sectional shape, and wherein a high-k gate dielectric is formed in the flash memory cells.

FIG. 4 illustrates the cross-sectional view of flash memory cells 110 and logic MOS device 210 in accordance with alternative embodiments. These embodiments are similar to the embodiments shown in FIG. 2, except that word-line 122, instead of comprising a metal-containing portion 122A and polysilicon portion 122B, is formed of a homogenous material that comprises metal. Word-line 122 may have a rectangular cross-sectional view in these embodiments. In these embodiments, gate electrode 216, control gate 118, word-line portion 122A, and erase gate 130 are formed of a same metal-containing material. In the embodiments shown in FIG. 4, the same gate dielectric material and conductive barrier material for forming parts of logic MOS device 210 are also formed underlying control gate 118, word-line portion 122A, and erase gate 130.

FIGS. 5 and 6 briefly illustrate the formation of gate electrode 216, control gate 118, word-line portion 122A, 122B, and erase gate 130 as shown in FIG. 1. Referring to FIG. 5, an initial integrated circuit structure is formed. The initial integrated circuit structure includes floating gate dielectric 112, floating gate 114, dummy control gate 118', dummy word-line 122', and dummy erase gate 130' in device region 100. The initial integrated circuit structure further includes dummy gate electrode 216' in device region 200. The dummy features 118', 122', 130', and 216' are formed in Inter-Layer Dielectric (ILD) 42. In these embodiments, gate dielectric 212 and conductive barrier layer 224 are formed, and are underlying dummy gate electrode 216'. In some exemplary embodiments, dummy control gate 118', dummy word-line 122', dummy erase gate 130', and dummy erase gate 130' are formed of polysilicon.

Next, referring to FIG. 6, the dummy features including dummy control gate 118', dummy erase gate 130', and dummy erase gate 130' are removed in an etching step. Recesses 40 are formed due to the removal of the dummy features. Furthermore, a portion of dummy word-line 122' is removed, and portion 122B is left. In a subsequent process step, as shown in FIG. 7, metal-containing material 44 is filled into recesses 40, followed by a planarization such as a Chemical Mechanical Polish (CMP) to level the top surface of metal-containing material 44. The remaining portions of metal-containing material 44 thus form gate electrode 216, control gate 118, word-line portion 122A, and erase gate 130, as shown in FIG. 1. Due to the planarization, the top surfaces of gate electrode 216, control gate 118, word-line portion 122A, and erase gate 130 are coplanar.

The formation of the structures in FIGS. 2 through 4 may be appreciated through the teaching related to FIGS. 5 through 7. For example, the structure shown in FIG. 2 is formed by performing similar steps in FIGS. 5 and 6, except that after the removal of the dummy features, a dummy gate dielectric (if any) is also removed. After the recesses 40 (FIG. 6) are formed as a result of the dummy removal, a gate dielectric layer, a conductive layer, and a metal-containing material are formed, followed by a CMP. The resulting structure is shown in FIG. 2.

The formation of the structures shown in FIGS. 3 and 4 are similar to the steps shown in FIGS. 5 and 6, except that dummy features 122' (similar to what is shown in FIG. 5) have a rectangular cross-sectional-view shape rather than an L-shape. Accordingly, after the dummy removal step as shown in FIG. 6, dummy word-line 122' does not have remaining portions, and the rectangular word-lines 122 as shown in FIGS. 3 and 4 are formed.

The embodiments of the present application have some advantageous features. By forming the metal-containing control gates, the metal-containing word-lines, and the metal-containing erase gates, the charge-depletion problem that otherwise will occur in polysilicon control gates, word-lines, and erase gates is eliminated. The formation of the metal-containing control gates, word-lines, and erase gates share the process steps of logic MOS devices, and hence the process is compatible with logic device formation processes.

In accordance with some embodiments of the present disclosure, a flash memory cell includes a floating gate dielectric, a floating gate overlying the floating gate dielectric, a control gate overlying the floating gate, a word-line on a first side of the floating gate and the control gate, and an erase gate on a second side of the floating gate and the control gate. The control gate, the word-line, and the erase gate comprise a metal.

In accordance with alternative embodiments of the present disclosure, an integrated circuit structure includes a flash memory cell and a logic MOS device. The flash memory cell includes a floating gate dielectric, a floating gate overlying the floating gate dielectric, a control gate overlying the floating gate, a word-line on a first side of the floating gate and the control gate, and an erase gate on a second side of the floating gate and the control gate. The logic MOS device includes a high-k gate dielectric, and a gate electrode over the high-k gate dielectric. The gate electrode, the control gate, the word-line, and the erase gate are formed of a same metal-containing material, and have top surfaces coplanar with each other.

In accordance with yet alternative embodiments of the present disclosure, an integrated circuit structure includes a flash memory cell and a logic MOS device. The flash memory cell includes a floating gate dielectric, a floating gate overlying the floating gate dielectric, a control gate overlying the floating gate, and a word-line on a first side of the floating gate. The word-line includes a first portion comprising a metal, and a second portion comprising polysilicon. The first portion and the second portion form an L-shape in a cross-sectional view. The first portion is in physical contact with the second portion. The flash memory cell further includes an erase gate on a second side of the floating gate. The logic MOS device includes a high-k gate dielectric, and a gate electrode over the high-k gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a flash memory cell comprising:
      a floating gate dielectric;
      a floating gate overlying the floating gate dielectric;
      a control gate overlying the floating gate;
      a word-line on a first side of the floating gate and the control gate; and
      an erase gate on a second side of the floating gate and the control gate, wherein the control gate, the word-line, and the erase gate comprise a metal; and
   a logic Metal-Oxide Semiconductor (MOS) device having a gate electrode, wherein the gate electrode, the control gate, the word-line, and the erase gate comprise a same metal-containing material, and top surfaces of the gate electrode, the control gate, the word-line, and the erase gate are coplanar.

2. The integrated circuit structure of claim 1, wherein the logic MOS device is a p-type MOS device.

3. The integrated circuit structure of claim 1, wherein the logic MOS device is an n-type MOS device.

4. The integrated circuit structure of claim 1, wherein the word-line comprises:
   a first portion comprising the same metal-containing material; and
   a second portion comprising polysilicon, wherein a first top surface of the first portion is higher than a second top surface of the second portion, and wherein sidewalls of the first portion and the second portion are in contact with each other.

5. The integrated circuit structure of claim 1 further comprising:
   a dielectric layer; and
   a conductive barrier layer over the dielectric layer, wherein each of the dielectric layer and the conductive barrier layer comprises:
      a portion underlying each of the control gate, the word-line, and the erase gate; and
      sidewall portions on sidewalls of the each of the control gate, the word-line, and the erase gate.

6. The integrated circuit structure of claim 4, wherein an edge of the first portion and an edge of the second forming an interface, with the same metal-containing material and the polysilicon contacting with each other at the interface.

7. An integrated circuit structure comprising:
   a flash memory cell comprising:
      a floating gate dielectric;
      a floating gate overlying the floating gate dielectric;
      a control gate overlying the floating gate;
      a word-line on a first side of the floating gate and the control gate; and
      an erase gate on a second side of the floating gate and the control gate; and
   a logic Metal-Oxide Semiconductor (MOS) device comprising:
      a high-k gate dielectric; and
      a gate electrode over the high-k gate dielectric, wherein the gate electrode, the control gate, the word-line, and the erase gate comprise a same metal-containing material, and have top surfaces coplanar with each other.

8. The integrated circuit structure of claim 7, wherein the word-line comprises:
   a first portion formed of the same metal-containing material; and
   a second portion comprising polysilicon, wherein the first portion and the second portion in combination have an L-shaped cross-sectional view, and wherein sidewalls of the first portion and the second portion are in contact with each other.

9. The integrated circuit structure of claim 8, wherein the second portion of the word-line and the floating gate are on opposite sides of the first portion of the word-line.

10. The integrated circuit structure of claim 7 further comprising:
    a dielectric layer; and
    a conductive barrier layer over the dielectric layer, wherein each of the dielectric layer and the conductive barrier layer comprises:
       a portion underlying each of the control gate, the word-line, and the erase gate; and
       sidewall portions on sidewalls of the each of the control gate, the word-line, and the erase gate.

11. The integrated circuit structure of claim 7, wherein the metal-containing material has a work function higher than about 4.8 eV.

12. The integrated circuit structure of claim 7, wherein the metal-containing material has a work function lower than about 4.2 eV.

13. The integrated circuit structure of claim 7, wherein the floating gate comprises polysilicon.

14. An integrated circuit structure comprising:
    a flash memory cell comprising:
       a floating gate dielectric;
       a floating gate overlying the floating gate dielectric;
       a control gate overlying the floating gate;
       a word-line on a first side of the floating gate, wherein the word-line comprises:

a first portion comprising a first edge facing the floating gate, and a second edge opposite to the first edge, wherein an entirety of the first portion comprises a metal; and
a second portion comprising polysilicon, wherein the first portion and the second portion form a vertical leg and horizontal leg, respectively, of an L-shape in a cross-sectional view, and wherein the second edge of the first portion is in physical contact with an edge of the second portion to form an interface; and an erase gate on a second side of the floating gate; and
a logic Metal-Oxide Semiconductor (MOS) device comprising:
a high-k gate dielectric; and
a gate electrode over the high-k gate dielectric.

15. The integrated circuit structure of claim 14, wherein the gate electrode, the control gate, the word-line, and the erase gate comprise a same metal-containing material, and wherein the gate electrode, the control gate, the word-line, and the erase gate have top surfaces coplanar with each other.

16. The integrated circuit structure of claim 14, wherein the second portion of the word-line and the floating gate are on opposite sides of the first portion of the word-line.

17. The integrated circuit structure of claim 14 further comprising:
a dielectric layer; and
a conductive barrier layer over the dielectric layer, wherein each of the dielectric layer and the conductive barrier layer comprises a portion underlying each of the control gate, the word-line, and the erase gate.

18. The integrated circuit structure of claim 14, wherein the first portion of the word-line has a work function higher than about 4.8 eV.

19. The integrated circuit structure of claim 14, wherein the first portion of the word-line has a work function lower than about 4.2 eV.

20. The integrated circuit structure of claim 14, wherein the metal and the polysilicon contact with each other at a vertical interface between the first portion and the second portion.

* * * * *